United States Patent [19]
Baudouin et al.

[11] Patent Number: 6,040,983
[45] Date of Patent: Mar. 21, 2000

[54] VERTICAL PASSIVE COMPONENTS FOR SURFACE MOUNT ASSEMBLY

[75] Inventors: Daniel Baudouin, Missouri City; Ernest J. Russell, Richmond; Jeffrey W. Janzen, Missouri City, all of Tex.

[73] Assignee: Texas Instruments Incorporated, Dallas, Tex.

[21] Appl. No.: 09/041,902

[22] Filed: Mar. 13, 1998

Related U.S. Application Data

[60] Provisional application No. 60/043,101, Apr. 16, 1997.

[51] Int. Cl.$^7$ .................................................. H05K 7/02
[52] U.S. Cl. ........................ 361/760; 361/763; 361/764; 361/765; 361/766; 361/767; 361/782; 361/783; 257/766; 257/686; 257/724; 228/123.1
[58] Field of Search ........................... 361/760, 763–767, 361/772, 774, 777, 782, 783, 301.2, 301.4, 302, 306.1, 308.1; 257/766, 686, 724; 228/123.1

[56] References Cited

FOREIGN PATENT DOCUMENTS

| | | | |
|---|---|---|---|
| 57-194588 | 5/1981 | Japan | 257/766 |
| 60-64457 | 9/1983 | Japan | 257/766 |
| 3-141666 | 10/1989 | Japan | 257/724 |
| 3-280487 | 3/1990 | Japan | 439/83 |
| 4-167585 | 6/1992 | Japan | 439/83 |

OTHER PUBLICATIONS

IBM Technical Disclosure Bulletin vol.33 No. 1A, Jun. 1990.

*Primary Examiner*—Leo P. Picard
*Assistant Examiner*—David Foster
*Attorney, Agent, or Firm*—Robby T. Holland; Carlton H. Hoel; Frederick J. Telecky, Jr.

[57] ABSTRACT

In a surface mount assembly, an active integrated circuit device, such as, for example, a dynamic random access memory, typically has a lead finger attached to a solder pad of a printed wiring board. The surface mount assembly is significantly improved by configuring a passive component, such as a resistor or capacitor, such that it has metallic terminations on an upper and lower surface so that it may be positioned between the solder pad of the printed wiring board and the lead finger.

4 Claims, 1 Drawing Sheet

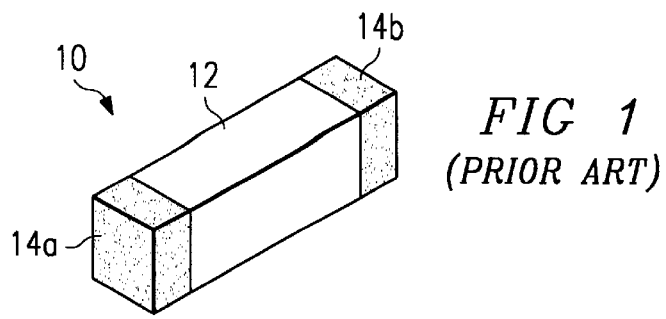
FIG 1 (PRIOR ART)
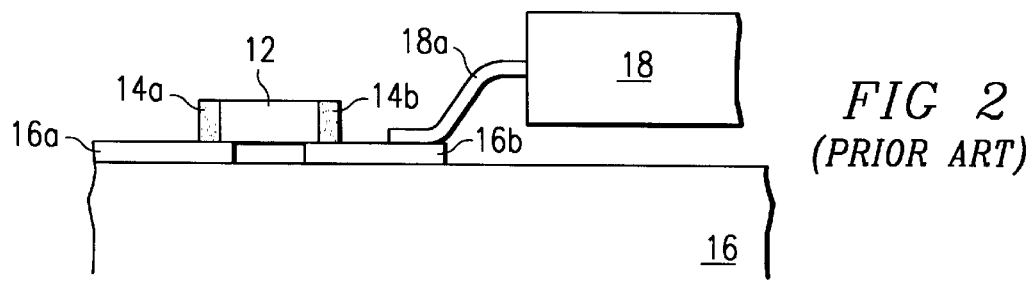
FIG 2 (PRIOR ART)
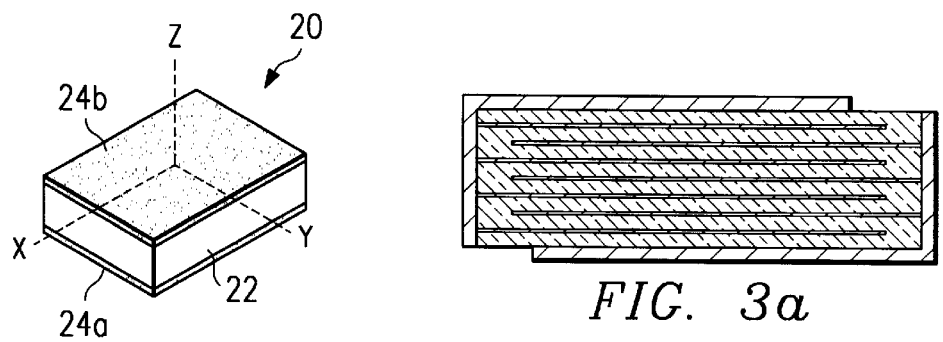
FIG 3
FIG. 3a
FIG. 4

VERTICAL PASSIVE COMPONENTS FOR SURFACE MOUNT ASSEMBLY

This is a Non Provisional application filed under 35 USC 119(e) and claims priority of prior provisional, Ser. No. 60/043,101 of inventor Baudouin, et al., filed Apr. 16, 1997.

FIELD OF THE INVENTION

This invention relates generally to the field of electrical components and more specifically to passive electrical devices mounted on printed wiring boards.

BACKGROUND OF THE INVENTION

As the semiconductor industry moves towards higher circuit densities and larger memory sizes (such as 64 megabit dynamic random access memories "DRAMs" and 256 megabit DRAMs) more stringent requirements are being placed on low frequency noise suppression (also known as power line de-coupling) and noise filtering systems on printed wiring boards (PWBs), or printed circuit boards. De-coupling, or bypass, capacitors are necessary to provide a temporary supply of charge to the active integrated circuits as the output of power supplies connected to the integrated circuits varies. In this way, circuit operation is not compromised due to a temporary drop in voltage supply. De-coupling capacitors are typically in the 0.5 to 1 microfarad range. They are located between the power supplies and the ground. The trace on the board can be at the power supply voltage and the pin linked to circuit ground or the reverse. To enhance de-coupling, these bypass capacitors need to be as close to the active devices as possible in order for the inductance between the capacitors and the devices to be as small as possible. As circuits get more complex the number of power supplies increase and so the need for capacitors.

Resistors are needed to damp the "ringing" which is mostly due to the impedance mismatch and noise in the transmission line. A series resistor damps and isolates the noise on the signal line. Usually it is used close to the "t" junction where more noise and impedance mismatch is found. Also, a normal TTL driver has an impedance of around 20 ohms and the signal line on the PCB has a 50–70 ohms impedance. Connecting them directly would result in a major mismatch which will affect signal integrity on the line. A series resistor will improve the match and as a result reduce the ringing. Also for TTL or LVTTL using a series resistor does not affect the power on output voltage level of the driver significantly while it helps signal integrity. Usually, these resistors go in the input/output lines with values typically 10–15 ohms.

The use of inductances in surface mount is rare and mostly reserved to filter circuits in analog circuits. But when needed they can also go under the lead.

As integrated circuits get smaller and smaller and as the lead pitch of active components get smaller and smaller there is less and less space on the board for passive components such as resistors, capacitors and inductors. In particular, de-coupling capacitors are a problem since each memory integrated circuit needs at least one. Also, resistors used in the input and outputs of memory devices are becoming more of a problem since memories are offered in a variety of configurations such as X1, X4, X8, X16, X32 and X64. Such configurations are typically packaged in SIMM modules with each DRAM having about 2200 leads.

Prior art FIG. 1 illustrates a present passive component which is generally representative of a resistor, capacitor or inductor. The passive component 10 is generally in the shape of a parallelepiped having a body 12 with terminations 14a and 14b on each end of the body. The terminations 14a and 14b are metallic for the purpose of making electrical connection and usually are located at the short section ends of component 10 in either an annular or terminal shape. The capacitor of prior art FIG. 1 would typically have a ceramic body 12. Prior art FIG. 2 depicts the passive component 10 mounted to a printed wiring board 16 and an integrated circuit device 18 mounted to the printed wiring board 16. The passive component 10 is mounted to board 16 with its long dimension parallel to board 18; ie, it is mounted horizontally. Terminations 14a and 14b are attached to copper covered by solder lands 16a and 16b on board 16. Lead finger 18a of integrated circuit device 18 is attached to land 16b. The lead finger is illustrated in the typical shape. The lead fingers and passive component terminations would typically be attached to the lands of printed wiring board 16 in a solder reflow operation. While prior art FIGS. 1 and 2 depict passive component 10 as a parallelpiped, other passive components have a cylindrical shape that are mounted with their long axis parallel to the printed board.

The shape, size and orientation of the present passive electrical components forces the user to mount them adjacent to the active devices which waste a great deal of space on the assembly. The option of mounting the passive components under the bodies of the active devices does not exist anymore since the active devices have thinned down and sit within mils of the PWB or sit on the PWB. The option of imbedding the passive components in the PWB does not exist anymore because of layout reasons. Other options include incorporating the passive components into the integrated circuit package as disclosed in U.S. Pat. No. 5,115,298 issued on May 19, 1992 to Wah K. Loh, assigned to Texas Instruments Incorporated and as disclosed in U.S. Pat. No. 4,598,307 issued on Jul. 1, 1986 to Wakabayashi et al., assigned to Fujitsu.

What is needed is a solution that saves printed wiring board space while placing the passive component as close as possible to the active device.

It is accordingly an object of this invention to provide a passive component that can be mounted to a printed wiring board in close proximity to the active electrical device and while saving space over prior art externally mounted passive devices.

Other objects and advantages of the invention may be apparent to those of ordinary skill in the art, having the benefit of the following specification and drawings herein.

SUMMARY OF INVENTION

A passive electrical component is configured for attachment to a printed wiring board by having metallic terminations on upper and lower ends for vertical mounting in order to save space as opposed to prior art horizontal mounting.

BRIEF DESCRIPTION OF THE DRAWINGS

FIG. 1 is a prior art drawing illustrating a passive electrical component 10.

FIG. 2 is a prior art drawing illustrating the prior art electrical component 10 attached to a printed wiring board.

FIG. 3 is a drawing illustrating a passive electrical component according to a preferred embodiment of the invention.

FIG. 3a is a drawing illustrating a capacitor according to a preferred embodiment of the invention.

FIG. 4 is a drawing illustrating the inventive electrical component of FIG. 3 attached to a printed wiring board.

DESCRIPTION OF PREFERRED EMBODIMENT

FIG. 3 is a drawing illustrating a passive electrical component 20 according to the preferred embodiment of the invention. The component 20 may be, for example, a resistor, capacitor or inductor. It has a body 22 with metallic terminations 24a and 24b on each end. However, unlike prior art component 10 of FIG. 1 which is configured for horizontal attachment to a PWB, the inventive component 20 is configured for vertical attachment to a PWB. Terminations 24a and 24b are on the upper and lower sides of body 22 and may be comprised of a solder material. The component 20 is approximately the size of the soldering pad for the active component and can be in horizontal section round, square, rectangular or any other shape approximating the shape of the soldering pad and lead. The thickness of component 20 is relatively small, and may be (for example) up to about 30 to 40 mills thick. It should be about the same or smaller in width than the size of a lead finger and may extend outside the lead finger.

As a resistor, component 20 of FIG. 3 allows the classic conductive device to used by changing the format to provide mechanical stability by reducing the length and increasing the cross section. Another implementation is to take a wafer of highly doped (conductive) semiconductor or poorly conductive metal and form solderable metal on both sides (such as by depositing it) and then dicing the wafer.

As a capacitor, component 20 of FIG. 3 allows the classical ceramic capacitor used in surface mount to be used when terminations are extended to the top and bottom. FIG. 3a more clearly illustrates a capacitor embodiment. Another implementation is to manufacture a thin capacitor by taking a wafer of metal or semiconductor and depositing a layer of metal, a layer of a constant dielectric insulator (such as a high "k" dielectric material), another layer of metal and adding on each side a layer of solderable metal and then dicing the wafer to proper size.

FIG. 4 depicts the inventive passive electrical component 20 mounted to a printed wiring board 16 along with an integrated circuit device 18. The z axis, vertical axis, of component 20 is attached by termination 24a to printed wiring board 16 and is attached by termination 24b to the underside of lead finger 18a of active electrical component 18. Solder reflow is typical of the process used in attaching the component 20 and device 18 to printed wiring board 16.

In FIG. 4, only one lead finger 18a of active electrical component 18 is shown. As for other lead fingers of electrical component 18, some will be similarly attached to other passive devices 20 and some will be directly connected to PWB 16. To make up for the thickness of the vertical passives 20 for those leads directly connected to PWB 16, several methods may be utilized. The simplest one is to place the passives on the PWB and then press the lead fingers of the integrated circuit onto the passives and the PWB. This will reshape the lead fingers that stand on the passives. The second method is to shape the lead fingers that will sit on the passives in a different plane than the directly connected lead fingers. This may be accomplished during the manufacture of the integrated circuit. A third method is to use a passive device having zero value (no resistance, capacitance or inductance) under the lead fingers that do not need passives so all the leads can be on the same plane.

This invention considerably reduces the space needed on the PWB by using the z axis to hide the passive components under the lead fingers of the active devices. It also makes the fabrication of the passive devices much simpler since capacitors and resistors can be produced in sheets with the terminations being sprayed, sputtered or soldered on.

While the invention has been described with reference to illustrative embodiments, this description is not intended to be construed in a limiting sense. Various other embodiments of the invention will be apparent to persons skilled in the art upon reference to this description. It is therefore contemplated that the appended claims will cover the above embodiments and any such modifications as fall within the true scope and spirit of the invention.

What is claimed is:

1. A surface mounted assembly, comprising:
   a printed wiring board having a solder pad on a surface thereof;
   an active integrated circuit device having a lead finger disposed over the solder pad; and
   a passive device having a first end and a second end that is disposed between the solder pad and the lead finger with the first end attached to the solder pad on the surface of the printed wiring board and the second end attached to the lead finger of the active integrated circuit device.

2. The surface mount assembly of claim 1 wherein the first end and the second end of the passive device are attached by solder.

3. The surface mount assembly of claim 2 wherein the passive device is a capacitor.

4. The surface mount assembly of claim 2 wherein the passive device is a resistor.

* * * * *